(12) United States Patent
Atsatt et al.

(10) Patent No.: US 12,057,836 B2
(45) Date of Patent: Aug. 6, 2024

(54) LOGIC FABRIC BASED ON MICROSECTOR INFRASTRUCTURE

(71) Applicant: Intel Corporation, Santa Clara, CA (US)

(72) Inventors: Sean R Atsatt, Santa Cruz, CA (US); Arun Jangity, Sunnyvale, CA (US); Thien Le, San Jose, CA (US); Simon Chong, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 745 days.

(21) Appl. No.: 17/033,342

(22) Filed: Sep. 25, 2020

(65) Prior Publication Data
US 2021/0013885 A1 Jan. 14, 2021

(51) Int. Cl.
*H03K 19/177* (2020.01)
*H03K 3/037* (2006.01)
*H03K 19/17724* (2020.01)
*H03K 19/17736* (2020.01)
*H03K 19/1776* (2020.01)

(52) U.S. Cl.
CPC ......... *H03K 19/1776* (2013.01); *H03K 3/037* (2013.01); *H03K 19/17724* (2013.01); *H03K 19/17736* (2013.01)

(58) Field of Classification Search
CPC ............. H03K 3/037; H03K 19/17724; H03K 19/17736; H03K 19/1776
See application file for complete search history.

(56) References Cited

U.S. PATENT DOCUMENTS

| | | | |
|---|---|---|---|
| 6,255,848 B1* | 7/2001 | Schultz | H03K 19/1776 326/38 |
| 9,432,298 B1* | 8/2016 | Smith | H04L 49/9057 |
| 10,523,207 B2 | 12/2019 | How et al. | |
| 10,673,440 B1* | 6/2020 | Camarota | G06F 7/483 |
| 2007/0143577 A1 | 6/2007 | Smith | |
| 2018/0262198 A1* | 9/2018 | Tate | H03K 19/17736 |
| 2019/0043536 A1* | 2/2019 | Weber | H03K 19/1776 |
| 2021/0013885 A1 | 1/2021 | Atsatt et al. | |
| 2023/0251839 A1 | 8/2023 | Shah et al. | |

OTHER PUBLICATIONS

European Search Report for Application No. 21190629.2 mailed Feb. 11, 2022.
Akbar Ma et al.: "Bit error rate 1-9 improvement using ESPRIT based beamforming and RAKE receiver", Multitopic Conference, 2009. INMIC 2009. IEEE 13th International, IEEE, Piscataway, NJ, USA, Dec. 14, 2009 (Dec. 14, 2009), pp. 1-6, XP031612370, ISBN: 978-1-4244-4872-2.

\* cited by examiner

*Primary Examiner* — Kurtis R Bahr
(74) *Attorney, Agent, or Firm* — Fletcher Yoder, P.C.

(57) ABSTRACT

Systems and methods described herein may relate to providing a dynamically configurable circuitry able to be programed using a microsector granularity. Furthermore, selective partial reconfiguration operations may be performed use write operations to write a new configuration over existing configurations to selectively reprogram a portion of programmable logic. An n-bit data register (e.g., a 1-bit data register) and/or control circuitry receiving data and commands from an access register disposed between portions of programmable logic may enable at least some of the operations described.

20 Claims, 10 Drawing Sheets

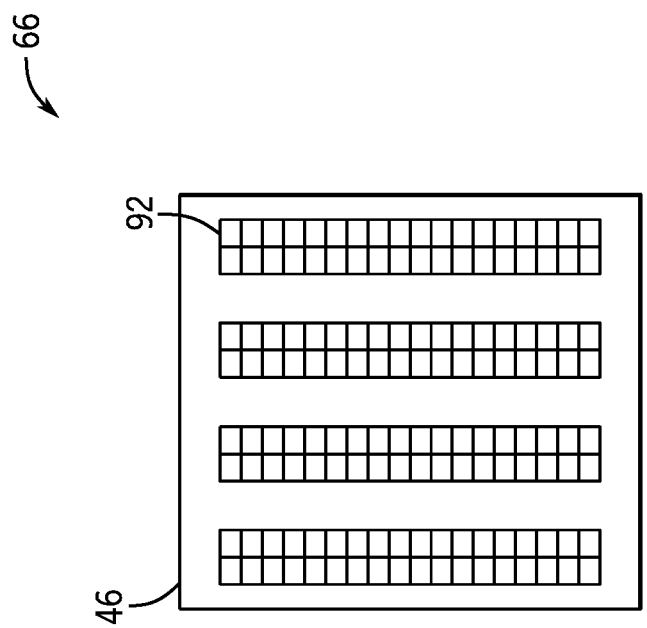

LOGIC FABRIC BASED ON MICROSECTOR INFRASTRUCTURE

BACKGROUND

The present disclosure relates to integrated circuit devices that use programmable structures arranged in microsectors.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Advances in microelectronics have enabled the continued increase in transistor densities and bandwidths for a variety of integrated circuit devices and communication techniques. Indeed, some advanced integrated circuits, such as field programmable gate arrays (FPGAs) or other programmable logic devices, may include large number of transistors that enable an increasingly wide variety of programmable circuit designs to be programmed into programmable fabric for implementation of a large number of different functions. In some cases, data generated by the functions may be packetized and routed to or from other devices to execute an operation or to communicate results of an operation. However, since a circuit design for a programmable logic device may be customized by a user for a particular application, relatively large sector-based registers used in logic fabric of these devices may over-allocate regions within the logic fabric for the circuit design.

BRIEF DESCRIPTION OF THE DRAWINGS

Advantages of the present disclosure may become apparent upon reading the following detailed description and upon reference to the drawings in which:

FIG. 5 is a block diagram of the programmable logic of FIG. 4B, in accordance with an embodiment;

DETAILED DESCRIPTION OF SPECIFIC EMBODIMENTS

Figure 1:
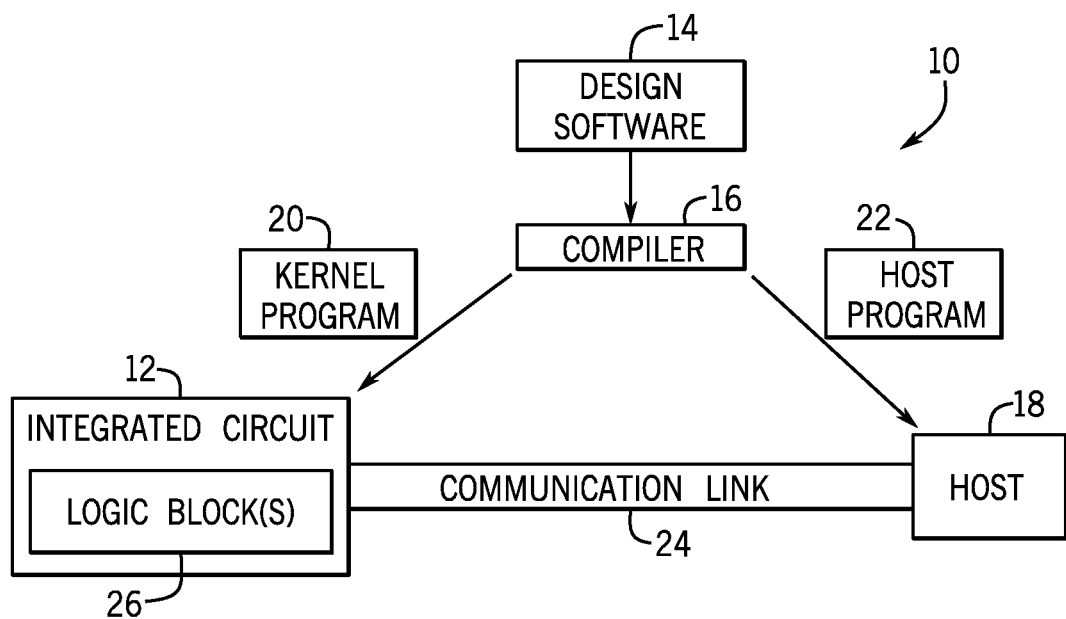
FIG. 1 is a block diagram of a system used to program an integrated circuit, in accordance with an embodiment.

One or more specific embodiments of the present disclosure will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. The techniques presented and claimed herein are referenced and applied to material objects and concrete examples of a practical nature that demonstrably improve the present technical field and, as such, are not abstract, intangible or purely theoretical.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical exclusive-OR (XOR)). In other words, the phrase A "or" B is intended to mean A, B, or both A and B.

Programmable logic devices are increasingly permeating markets and are increasingly enabling customers to implement circuit designs in logic fabric (e.g., programmable logic). Due to the highly customizable nature of programmable logic devices, the logic fabric is to be configured with a circuit design prior to use of the circuit corresponding to the circuit design. When implementing designs in the logic fabric, sectors may be used to allocate portions of the logic fabric to implementation of the circuit. However, a sector may be a relatively imprecise and/or large allocation of total logic fabric area due at least in part to data registers and physical arrangements of interconnections of the programmable logic device.

By rearranging some of the interconnections of the programmable logic device and/or by shrinking a data width of the data registers, systems and processes for implementing a circuit design in logic fabric may improve. For example, by making some of these changes, a size of the sector may be reduced and form a mircosector, permitting a relatively finer granularity of assignment to be used to allocate the logic fabric to the circuit design. This may, for example, permit a more efficient allocation of resources to respective circuit designs, and thus enable circuit designs to use less resources in implementation.

Since a circuit design for a programmable logic device may be customized by a user for a particular application, the ability to partition and control the configuration of the device at a fine grain and/or in parallel (as may be afforded by rearrangement of the interconnections and/or shrinking of a data width of data registers) enables a number of advantages particular to devices with programmable logic. Some of the advantages may be in the construction of the device and some advantages are in the use models for the device that are enabled (e.g., enabled or permitted use cases). For construction of the device, fine-grained configurable regions may be a mechanism to enable building a device with a suitable or tailored amount of resources for implementation of that device. Some of the new use models are enabled by faster configuration, faster partial reconfiguration, and faster single-event update (SEU) detection for smaller regions of the device when compared to other systems and methods for programmable logic device programming.

These changes in system implementation may also improve (e.g., reduce) overall configuration times, including reducing configuration times used when performing partial reconfigurations, and may also enable faster single-event upset (SEU) detection. For example, the proposed structural changes described herein may enable partial reconfiguration to occur in similar amounts of time as a normal configuration.

The microsector infrastructure may use a smaller number of columns (e.g., 8 columns vs 50 columns) in a single fabric row (row region). The row region may receive data from a smaller data register (e.g., 1-bit data register as opposed to a 32-bit data register). Since a mircosector may represent a relatively small percentage of area of a programmable logic device (e.g., less than 1% of total fabric area), it may be feasible to have the microsector become the partial reconfiguration quanta. This may enable the partial reconfiguration to be a write-only operation that avoids performing a read-modify-write each time partial reconfiguration is to occur for the microsector, thereby saving time and resources for the partial reconfiguration. In some cases, the partial reconfiguration time may be reduced by a factor of five or six, a relatively high amount of performance improvement. Furthermore, since the number of columns is reduced, the amount of time spent waiting for a data transmission to complete (either to the row region or from the row region) is reduced, thereby improving operation of the programmable logic device.

With the foregoing in mind, FIG. 1 illustrates a block diagram of a system 10 that may implement arithmetic operations. A designer may desire to implement functionality, such as the arithmetic operations of this disclosure, on an integrated circuit 12 (e.g., a programmable logic device such as a field-programmable gate array (FPGA) or an application-specific integrated circuit (ASIC)). In some cases, the designer may specify a high-level program to be implemented, such as an OpenCL program, which may enable the designer to more efficiently and easily provide programming instructions to configure a set of programmable logic cells for the integrated circuit 12 without specific knowledge of low-level hardware description languages (e.g., Verilog or VHDL). For example, since OpenCL is quite similar to other high-level programming languages, such as C++, designers of programmable logic familiar with such programming languages may have a reduced learning curve than designers that are required to learn unfamiliar low-level hardware description languages to implement new functionalities in the integrated circuit 12.

The designer may implement high-level designs using design software 14, such as a version of INTEL® QUARTUS® by INTEL CORPORATION. The design software 14 may use a compiler 16 to convert the high-level program into a lower-level description. The compiler 16 may provide machine-readable instructions representative of the high-level program to a host 18 and the integrated circuit 12. The host 18 may receive a host program 22 which may be implemented by the kernel programs 20. To implement the host program 22, the host 18 may communicate instructions from the host program 22 to the integrated circuit 12 via a communications link 24, which may be, for example, direct memory access (DMA) communications or peripheral component interconnect express (PCIe) communications. In some embodiments, the kernel programs 20 and the host 18 may enable configuration of a logic block 26 on the integrated circuit 12. The logic block 26 may include circuitry and/or other logic elements and may be configured to implement arithmetic operations, such as addition and multiplication.

The designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
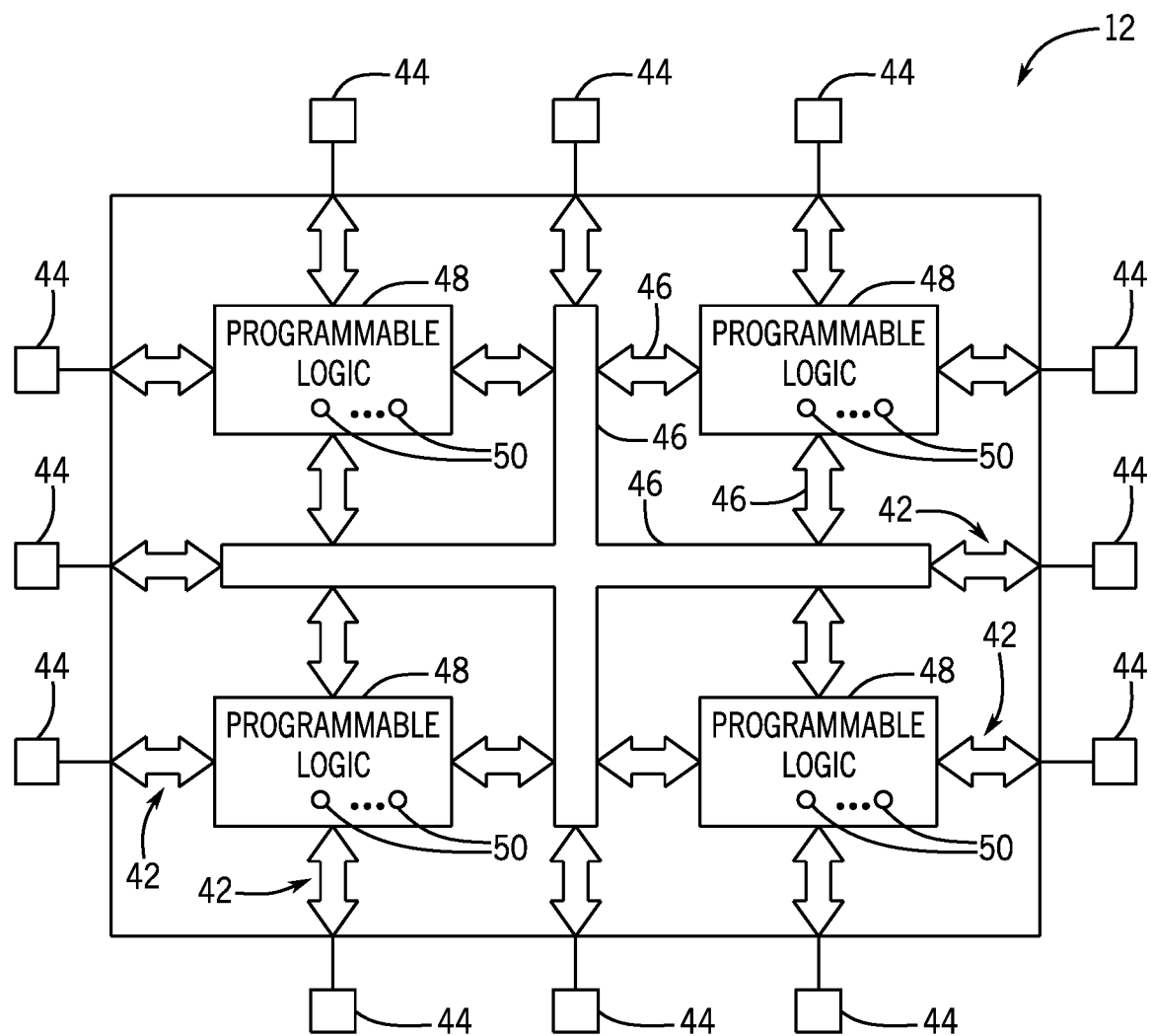
FIG. 2 is a block diagram of the integrated circuit of FIG. 1, in accordance with an embodiment.

Turning now to a more detailed discussion of the integrated circuit 12, FIG. 2 is a block diagram of an example of the integrated circuit 12 as a programmable logic device, such as a field-programmable gate array (FPGA). Further, it should be understood that the integrated circuit 12 may be any other suitable type of programmable logic device (e.g., an ASIC and/or application-specific standard product). As shown, integrated circuit 12 may have input/output circuitry 42 for driving signals off device and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit 12, may include programmable elements 50 with the programmable logic 48. For example, as discussed above, a designer (e.g., a customer) may (re)program (e.g., (re)configure) the programmable logic 48 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements 50. In general, programmable elements 50 may be based on any suitable programmable technology, such as fuses, antifuses, electrically-programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using pins 44 and input/output circuitry 42. In one embodiment, the memory cells may be implemented as random-access-memory (RAM) cells. The use of memory cells based on RAM technology is described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Keeping the discussion of FIG. 1 and FIG. 2 in mind, a user (e.g., designer) may utilize the design software 14 to implement the logic block 26 on the programmable logic 48 of the integrated circuit 12. In particular, the designer may specify in a high-level program that mathematical operations such as addition and multiplication be performed. The compiler 16 may convert the high-level program into a lower-level description that is used to program the programmable logic 48 to perform addition.

Figure 3:
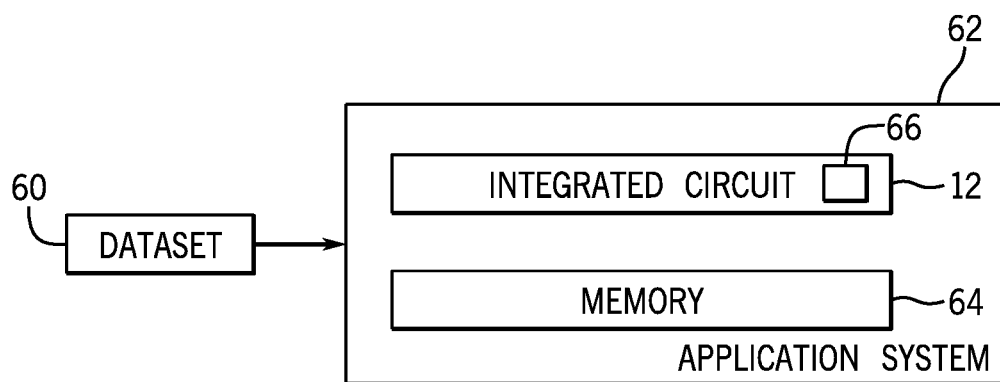
FIG. 3 is a block diagram of an application system that includes the integrated circuit of FIG. 1 and a memory, in accordance with an embodiment.

Once programmed, the integrated circuit 12 may process a dataset 60, as is shown in FIG. 3. FIG. 3 is a block diagram of an application system 62 that includes the integrated circuit 12 and memory 64. The application system 62 may represent a device that uses the integrated circuit 12 to perform operations based on computational results from the integrated circuit 12, or the like. The integrated circuit 12 may directly receive the dataset 60. The dataset 60 may be stored into the memory 64 before, during, or concurrent to transmission to the integrated circuit 12.

As bandwidths and processing expectations increase, such as in response to the advent of fifth generation (5G) and higher communication techniques and/or widespread use of neural networks (e.g., machine learning (ML) and/or artificial intelligence (AI) computations) to perform computations, the integrated circuit 12 may be expected to handle subsequent increases in size of the dataset 60 over time. The integrated circuit 12 may also be expected to perform digital signal processing operations of signals transmitted using 5G or higher techniques (e.g., signals of higher throughput and/or high data transmission bandwidths) and ML operations. These desired applications may also be implemented dynamically, during runtime, such as during a partial reconfiguration that causes configuration of a portion of the integrated circuit 12 without causing configuration of another portion of the integrated circuit 12 during runtime operations of the integrated circuit. For at least these reasons, it may be desired to improve configuration methods to meet complexity and timing specifications of technical computations. To do so, programmable logic 66 that includes at least the programmable logic 48, the input/output pins 44, and interconnection resources 46, may leverage a 1-bit data register to (re)configure the programmable logic 48 using mircosectors. Using microsectors to program circuitry functions in the programmable logic 48 may provide the advantages of enabling write-only reconfiguration, relatively smaller region SEU detection (e.g., 1-bit region of detection), relatively smaller granularities for reconfiguration regions, and relatively larger parallel configuration (e.g., parallel configuration of data channels of 1-bit width) operations. As used herein, the term microsector refers to a sector of programmable logic that has a data register that is comparatively small. In one example, a microsector has a 1-bit data register. In some embodiments, a microsector may have a larger data register, but still may be smaller than what is ordinarily found in a sector (e.g., may be less than 32 bits, less than 16 bits, less than 8 bits).

Figure 4B:
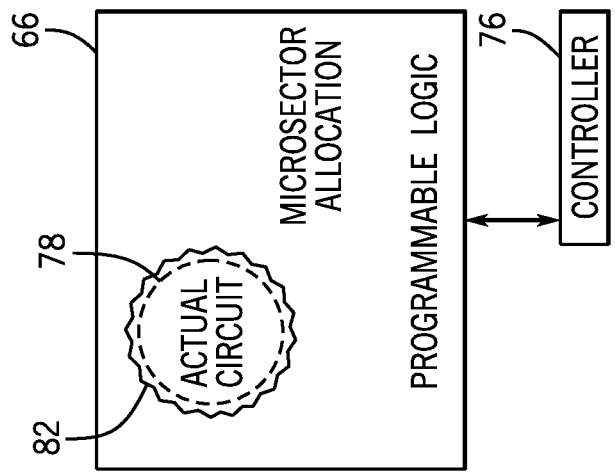
FIG. 4B is a block diagram of programmable logic of the integrated circuit of FIG. 1 implemented using microsector allocations, in accordance with an embodiment.
Figure 4A:
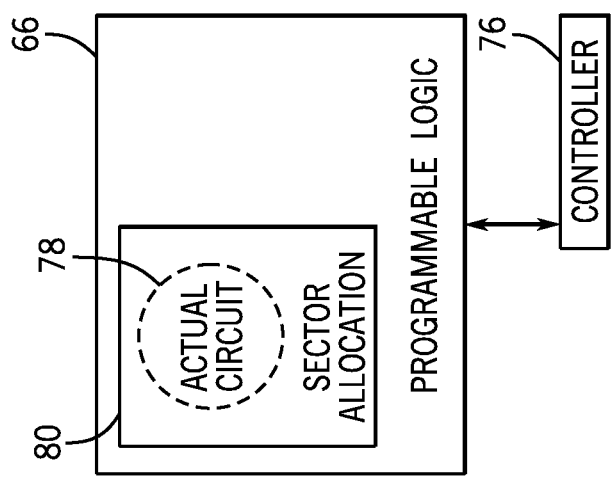
FIG. 4A is a block diagram of programmable logic of the integrated circuit of FIG. 1 implemented using sector allocations, in accordance with an embodiment.

To elaborate regarding the smaller granularities for reconfiguration regions, FIG. 4A is a block diagram of example programmable logic 66. The programmable logic 66 may include a controller 76 to program the programmable logic 66. When programmed, the circuitry of the programmable logic 66 may be used to perform digital signal processing, machine learning processing, computations, logic functions, or the like (e.g., represented by portion 78). However, the programmable logic 66 may be divided in relatively large logical sectors, and thus a portion 80 may be allocated to the circuitry as opposed to a region of circuitry corresponding to the portion 78. This overallocation of resources may waste circuitry since size differences between the portion 80 and the portion 78 represent underutilized programmable logic 66. It is noted that when partially reconfiguring programmable logic 66, certain speed metrics may be desired to be met (e.g., partial reconfiguration may be desired to be completed in a relatively fast amount of time). In these cases, for example, overallocation of resources may occur since slower configuration speeds may be undesired that may improve allocation of resources.

Indeed, if a device is built in the programmable logic of a multiple of sectors, the device may likely have more or less logic (e.g., logic arithmetic blocks (LABs), digital signal processing (DSP) blocks) than is desired to be allocated to building the device. This overallocation may occur since a rectangular number of sectors is used to implement the example device. By rearranging the interconnections and/or shrinking a data width of data registers to form microsectors, a relatively more exact amount of logic (e.g., more accurate number of LABs or DSP blocks) may be allocated to implementation of the device.

When implementing circuitry represented by the portion 78 in programmable logic 66 that uses microsector logical divisions, as shown in FIG. 4B, less programmable logic 66 may be wasted when implementing the circuitry. FIG. 4B is a block diagram of the programmable logic 66 implemented using microsectors. Indeed, microsectors may permit the circuitry corresponding to the portion 78 to be implemented in a region represented by portion 82. Although not drawn to scale, the portion 82 implementing circuitry corresponding to the portion 78 efficiently utilizing the programmable logic 66 where the portion 80 implementing the portion 78 may otherwise inefficiently utilize the programmable logic 66.

To elaborate further on a microsector architecture, FIG. 5 is a block diagram of the programmable logic 66. The programmable logic 66 may couple between microsectors 92 using the interconnection resources 46. Indeed, the interconnection resources 46 may include any suitable combination of data shifting registers, registers, logical gates, direct couplings, reprogrammable circuitry, or the like able to be used to move data from a first location to a second location within the programmable logic 66 and/or within the integrated circuit 12. One or more microsectors 92 may be programmed by the controller 76 with information to perform functions of circuitry, such as the circuitry corresponding to portion 78. However, since the controller 76 may transmit configuration data (or any suitable data), the granularity of regions used to program functions into the programmable logic 66 may reduce. When these granularities reduce or become more precise (e.g., smaller), programming of the programmable logic 66 may improve since circuit designs may be more efficiently configured in the programmable logic 66. It is noted that the programmable logic 66 and/or the integrated circuit 12 may be any suitable type of software or hardware, or a combination of the two. The integrated circuit 12 and/or the programmable logic 66 may be or include programmable logic 48, programmable elements 50, or the like, to enable one or more portions to be reprogrammable (e.g., reconfigurable). The controller 76 may interface with the microsectors 92 using the interconnection resources 46 that may include interface buses, such as an advanced interface bus (AIB) and/or an embedded multi-die interconnect bridge (EMIB). As described above, the programmable logic 66 may be a reprogrammable circuitry capable of performing a multitude of tasks.

Figure 6:
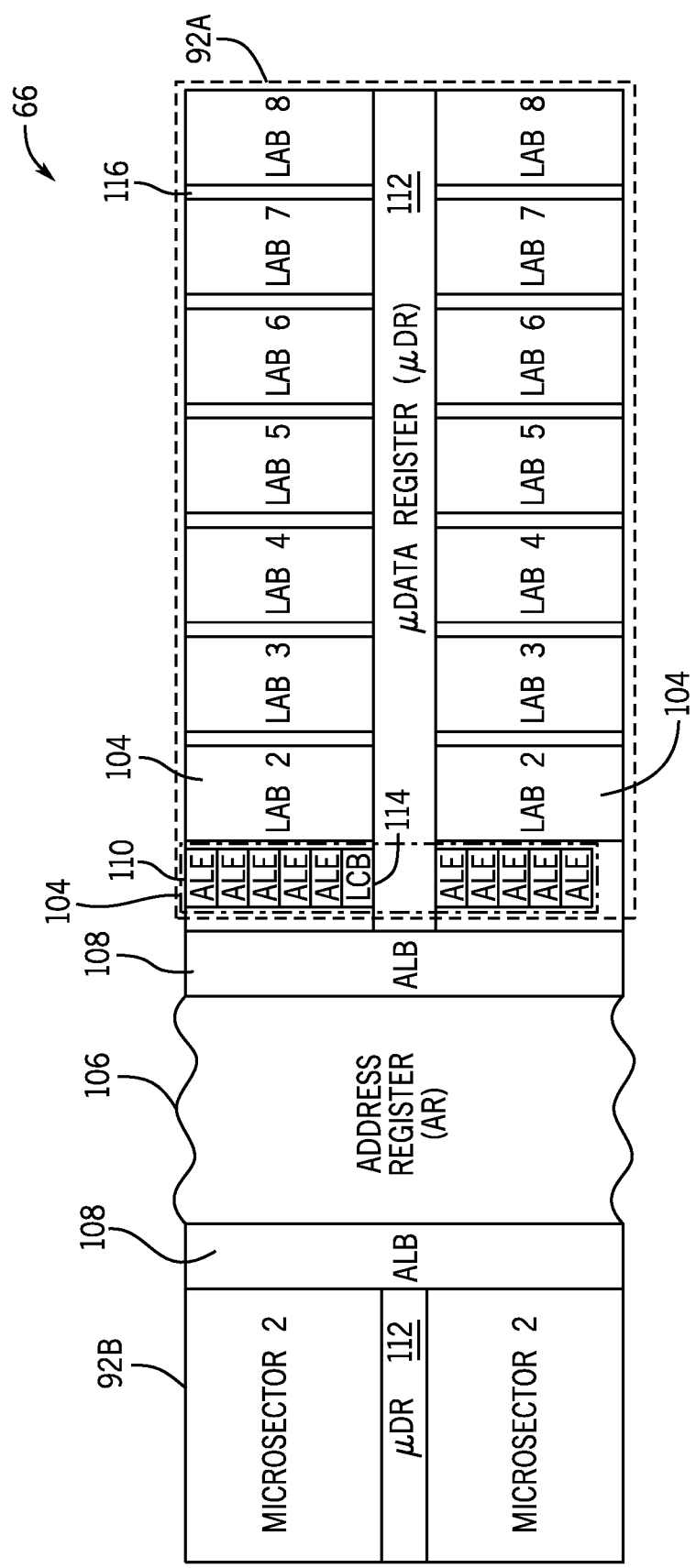
FIG. 6 is a block diagram of a microsector of the programmable logic of FIG. 5, in accordance with an embodiment.

FIG. 6 is a block diagram of two example microsectors 92 (e.g., microsector 92A, microsector 92B). This application describes a particular architecture of microsectors 92, however it should be understood that any suitable architecture may be used. Indeed, each microsector 92 may include one or more logic access blocks (LAB) 104 (e.g., eight LABs) able to interface with the interconnection resources 46 (shown here to communicate with the microsectors 92 via an address register 106 (AR)). Indeed, the interconnection resources 46 may include one or more ARs 106 to transmit and/or receive signals from the microsectors 92, as well as or in alternative of other control circuitry, logic circuitry (e.g., AND gates, OR gates, not-OR gates, exclusive-OR gates, flip-flops, switch-reset (SR) latches), or the like. It should also be understood that same or similar circuitry may be included in each microsector 92.

The LABs 104 may receive data from the AR 106 through an address line buffer (ALB) 108. The ALBs 108 may each include digital signal processing (DSP) circuitry and/or control circuitry that converts data from a suitable format for transmission to the microsector 92A to a suitable format for use by circuitry of the LAB 104.

Each LAB 104 may include some number of arithmetic logic element circuitry (ALE) 110 circuits (e.g., ten ALEs 110). A micro-data register (μDR) 112 may be disposed on at least some of the ALEs 110, such as in another layer of silicon, or other material, used to physically form the integrated circuit. The μDR 112 communicatively couples each LAB 104 to the ALB 108. Each ALE 110 of the LAB 104 may share and/or couple to the LAB-wide Control Block (LCB) 114. The LABs 104 are separated from each other by routing fabric 116 (e.g., configuration random access memory (CRAM), configuration memory). In this example, the μDR 112 runs through the LCB 114 via a center of a row of circuitry corresponding to the microsector 92A.

Figure 7:
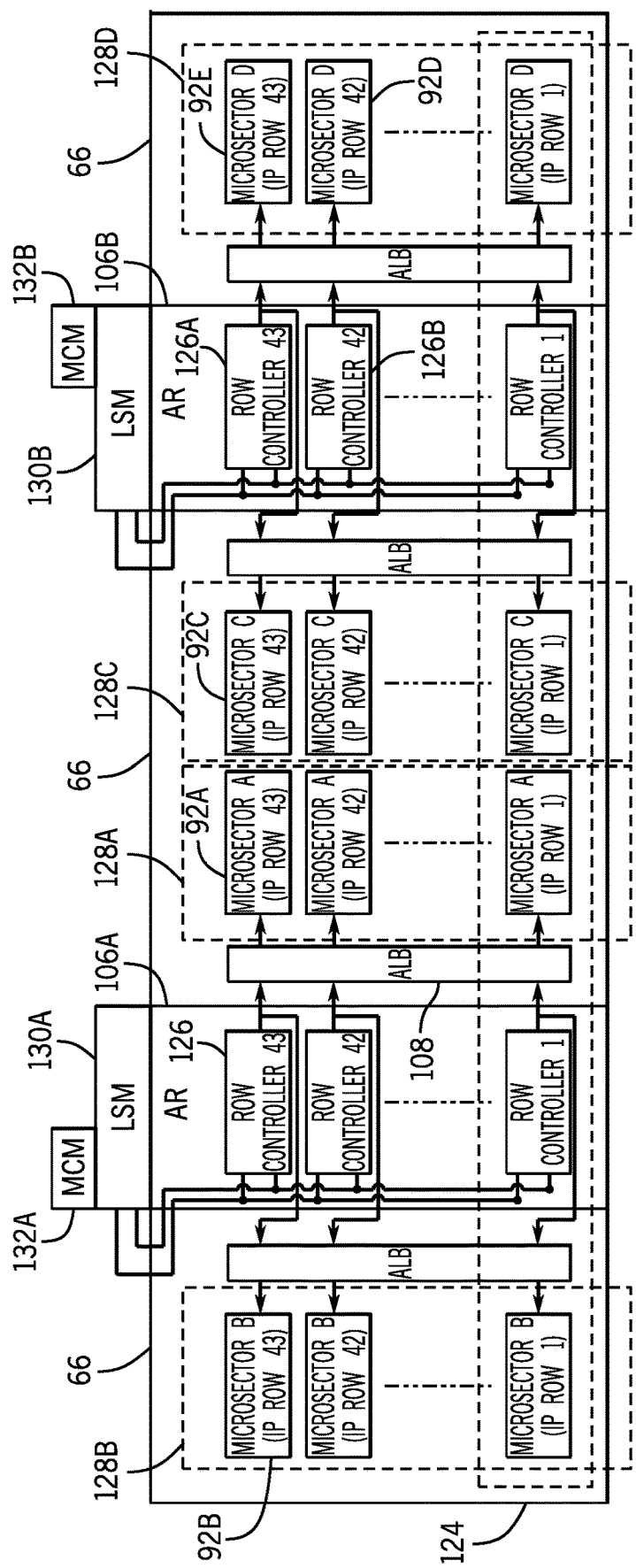
FIG. 7 is a block diagram of a portion of the programmable logic and at least some control circuitry for the portion of the programmable logic, in accordance with an embodiment.

To elaborate further on interconnections between the AR 106 and the microsectors 92, FIG. 7 is a block diagram of rows regions (row regions) 124 and row controllers 126 implemented in the AR 106 illustrating communicative couplings between the row controllers 126 and the microsectors 92 from FIG. 6. It is noted that microsectors 92 may sometimes be referred to in terms of row regions 124 since designs like manufacturer designs (e.g., manufacturer IP) or user designs (e.g., user IP) may be loaded into the microsectors 92 for implementation. The AR 106 may include any suitable control system circuitry and/or logic circuitry. Indeed, the AR 106 may be an address register from INTEL® STRATIX 10® or INTEL® AGILEX® by INTEL CORPORATION. Furthermore, the AR 106 is shown as disposed between at least two microsectors 92, however there are some instances where the AR 106 may be disposed by just one column region 128 of microsectors 92 (e.g., orientated on the right side of the AR 106 or on the left side of the AR 106) to accommodate physical boundaries of the programmable logic 66 or the integrated circuit 12 or to avoid supporting left and right data movement patterns. The various row regions 124 and column regions 128 are arranged as a grid on a same physical board.

Each row controller 126 may control a row region 124 of microsectors, and thus be associated with or be the ALB 108 described earlier. For the microsector implementation, the AR 106 may be repeated and shared between column region 128 (e.g., column region 128A, column region 128B, column region 128C, column region 128D) of microsectors 92. For example, column region 128A shares an AR 106A with the column region 128B, and is disposed adjacent to a column region 128C. The microsectors 92 of the column region 128C may share the AR 106B with microsectors 92 of the column region 128D. Thus, the microsectors 92 of column region 128C may be controlled using signals generated and/or transmitted by the row controllers 126 of the AR 106B independent of at least some signals transmitted via the AR 106A. Although part of a same row region 124, the microsector 92C may be controlled differently from the microsector 92B since the microsectors 92 being associated with different column region 128. Furthermore, although part of a same column region (e.g., column region 128C), the microsector 92C may be controlled differently from the microsector 92D since the microsectors 92 receive control signals from separate row controllers 126 (e.g., row controller 126A, row controller 126B). Microsectors 92 may be formed to divide the row region 124 into smaller portions, and thus provide the smaller granularity.

The row controllers 126 may use any suitable communication protocol to transmit and/or receive signals from respective microsectors 92. For example, the row controllers 126 may use a streaming protocol, such as AXI 4 Streaming, to receive an address and data corresponding to the address in a same symbol (e.g., same packet transmission) at internal write registers (e.g., internal to a respective row controller 126).

Each AR 106 may include a local sector manager (LSM) 130 (e.g., LSM 130A, LSM 130B) at the bottom or top of the AR 106 column region. For example, the LSM 130A is shown at the top of and communicatively coupled to the AR 106A column region. The LSM 130A is also disposed outside of the programmable logic 66. As shown, one LSM 130 may be included per AR 106, however it should be understood that LSMs 130 may be shared by two or more AR 106, such that one LSM 130 controls two or more AR 106.

Sometimes, the LSMs 130 may be integrated with an AR column manager (CM) 132 (e.g., CM 132A, CM 132B) to form a respective sector column managers (SCM). The CMs 132 may be responsible for managing transactions between its corresponding AR 106 and the interconnection resources 46. For example, the CM 132A may coordinate with the LSM 130A to transmit a command to the microsector 92A and the microsector 92B. The CM and LSMs 130 may be involved with routing commands, such as configuration instructions, to certain microsectors 92 from other portions of the integrated circuit 12 or from other microsectors 92. In cases where the interconnection resources 46 involve use of a network-on-chip, the CMs 132 may manage transactions between the network-on-chip and the corresponding AR 106. This arrangement may permit relatively high bandwidth data movement between master and slave bridges implemented via the interconnection resources 46 since, for example, the CMs 132 may help coordinate transmission between multiple microsectors and/or multiple ARs 106, such that the transmissions may be paralleled, or at least partially coordinated in time and/or in sequence.

A controller, such as the controller 76, may transmit packets to each of the LSMs 130 and/or CMs 132 that include data and commands to perform a configuration and a test of the configuration. To implement the configuration, one or more LSMs 130 may generate respective commands interpretable by respective row controllers 126, where the respective commands may be used to control configuration of one or more microsectors 92. The data and commands transmitted to a LSM 130 from the controller 76 may correspond to a portion of a circuit design represented by the configuration to be implemented in the subset of microsectors 92 managed (e.g., communicatively coupled) to the respective LSM 130. Once the configuration is implemented in the programmable logic 66 (or at least partially implemented), the one or more LSMs 130 may test the implemented configuration to verify that the configuration operates as expected. The test may be performed using a portion of the data and commands received by the LSM 130 from the controller 76. The LSMs 130 may test the respective portion of the circuit design corresponding to its respective intersections of column regions 128 and row regions 124 at least partially overlapping in time to the programming (e.g., configuration) of additional portions of the programmable logic 66, such as while one or more other row regions 124, column regions 128, or microsectors 92, continue to be programmed (e.g., configured). Once each portion of the programmable logic 66 is programmed, the LSMs 130 may coordinate in operation and perform a system-wide test of one or more circuit designs implemented in one or more microsectors 92. Testing performed may include aggregation operations that verify how portions of circuitry operate in addition to verifying how a whole circuit operates. Each LSM 130 may operate as a management engine for its local set of the microsectors 92.

Indeed, each row controller 126 may receive a command from its corresponding LSM 130 and may decode the command to generate control signals. The control signals may control operation of the corresponding row region 124 of microsectors 92. For example, the row controller 126A, coupled between the microsector 92C and the microsector 92E, may generate control signals used for controlling operation of the microsector 92C and the microsector 92E disposed in a same row region 124. Furthermore, as opposed to the LSM 130 controlling multiple column regions 128, each LSM 130 may control two columns regions 128.

For example, the LSM 130 may generate commands associated with read and write operations. In some cases, the LSM 130 may also command the row controller 126 to decompress (e.g., decode) data associated with the command before transmitting data to a respective microsector 92. The row controller 126 may be considered a configuration endpoint that may be read and/or written to by the LSM 130 and/or the controller 76 via the interconnection resources 46 to read or write data (e.g., configuration data, test data) to the microsector 92. It is noted that although shown as including 43 row regions 124, and 43 row controllers 126, any suitable number of row regions 124, column regions 128, and the like may be used in the integrated circuit 12 to implement systems and methods described herein.

Figure 8:
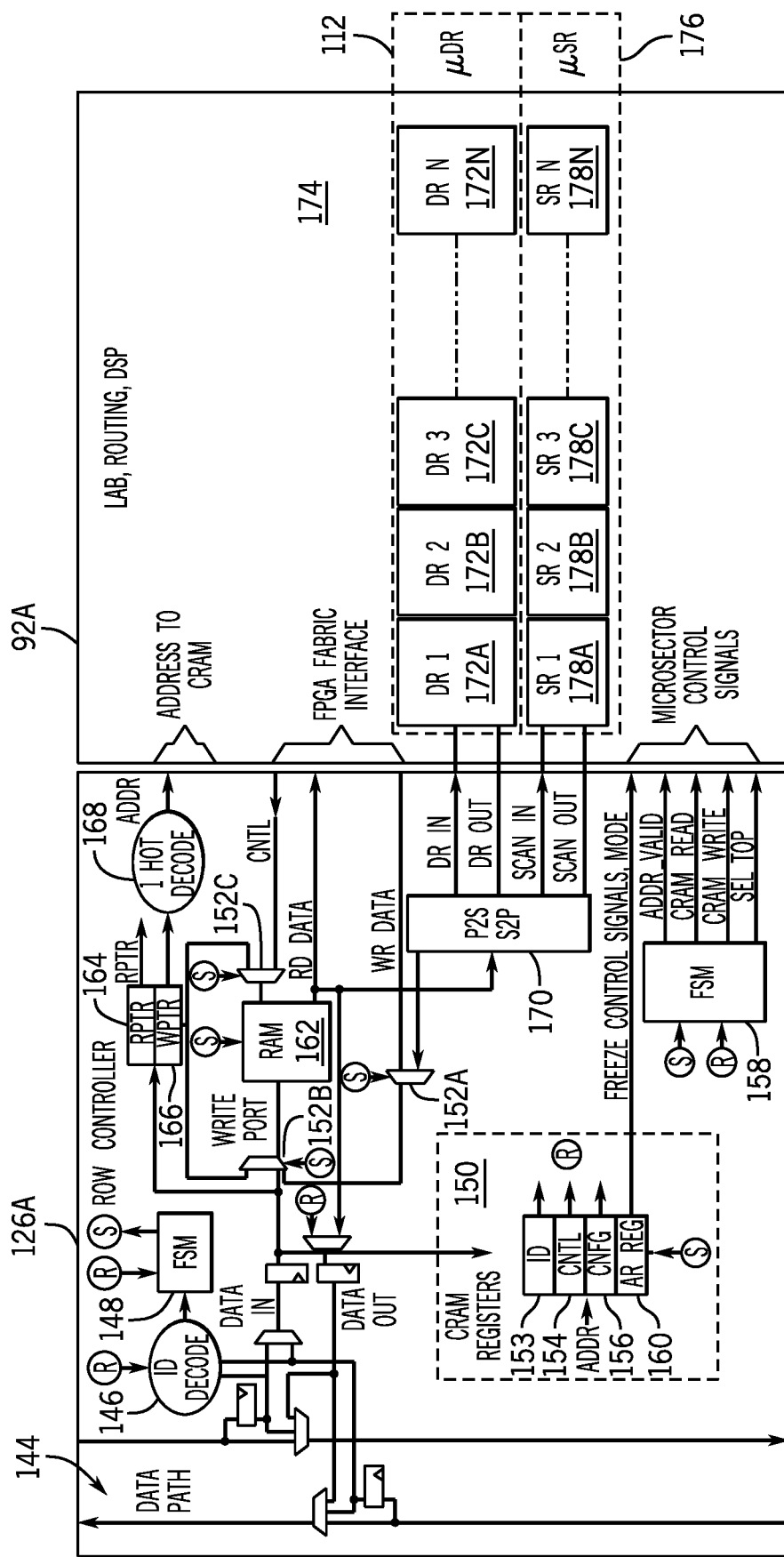
FIG. 8 is a block diagram of a row controller and the microsector of FIG. 6, in accordance with an embodiment.

To elaborate further on accessing the microsector 92, FIG. 8 is a block diagram of a respective row controller 126 and of a respective microsector 92. For ease of explanation, row controller 126A and microsector 92A are referenced. However, it should be understood that these descriptions are applicable to each row controller 126 and/or microsector 92.

The row controller 126 may receive the command from the LSM 130 via data path 144. Indeed, the LSM 130 may transmit commands as one or more packets (e.g., data packets) using the data path 144. An identifier decoder (ID Decode) block 146 may decode an identifier (ID) of the packet. By reading the ID of the packet and comparing to a stored ID indication, the ID Decode block 146 may identify whether the packet is relevant to the row controller 126A and/or whether the packet is intended to be received by the row controller 126A. The ID Decode block 146 may use one or more look-up tables, register values, and/or stored indications of its identifier. The data path 144 may be shared by each row controller 126 of a respective AR 106. As such, the data path 144 may also continue on to a subsequent row controller 126 of the AR 106A.

When the ID Decode block 146 identifies that a packet is for the row controller 126A, a finite state machine (FSM) 148 may perform logical sequencing to move the packet off of the data path 144. Register values received from the packet may be stored in configuration random access memory (CRAM) registers 150. It is noted that the CRAM registers 150 may be alternatively implemented in flip-flop circuitry or other logic circuitry, however CRAM-based registers may provide suitable memory storage capabilities to flip-lop circuitry or other logic circuitry while using a smaller footprint.

Register values may be referenced by other components throughout the row controller 126A. For example, from the packet, the FSM 148 and/or the ID Decode block 146 may receive signals indicative of register values (R). In response to the register values, the FSM 148 may generate a signal indicative of a state machine state (S). The state machine state may maintained by the FSM 148, where a state of an FSM of the FSM 148 may change in response to the register values (R) received from the CRAM registers 150 and/or in response to an output from the ID Decode block 146. The FSM 148 may output the state machine state (S) to the CRAM registers 150. The switching circuitry may change state to change a data path internal to the row controller 126A in response to the state machine state (S) output from the FSM 148.

Some of the CRAM registers 150 may not change in response to the packet being received by the row controller 126A. For example, identifier data stored in a controller identifier (ID) register 153 may be set at a time of initial configuration of the row controller 126A. However, if the row controller 126A is not preset with the identifier data stored in the ID register 153, the row controller 126A may set a value of the ID register 153 (e.g., the stored identifier) to an identified included in the packet.

The CRAM registers 150 may include a control (CNTL) register 154 that stores control bits. The control bits may define how the row controller 126A interacts with the data path 144, such as how the row controller 126A is to receive and/or access a packet from the data path 144. For example, the control bits may indicate to the ID Decode block 146 which subset of packets are relevant to the row controller 126A and thus should be taken off of the data path 144. The CRAM registers 150 may also include a configuration (CNFG) register 156 used to store configuration bits. The configuration bits may transmit to the FSM 148 and/or FSM 158 to change an operation of the row controller 126, such as an operation performed based on a state of the FSM 148 and/or the FSM 158. An AR register 160 may store configuration bits set by the AR 106 (e.g., AR 106A), for example to define an operation for one or more of the row controllers 126.

The state machine state (S) generated by the FSM 148 may be received by the FSM 158. Thus, the state of the FSM 158 may be based on the state of the FSM 148. The FSM 158 may use the state machine state (S) and/or the received register values (R) to manage sequencing used to perform read operations to read a CRAM of the microsector 92A, write operations to read the CRAM of the microsector 92A, read operations to read a user register of the microsector 92A, write operations to write the user register of the microsector 92A, and/or to perform SEU detection operations to detect errors in programming of the microsector 92A.

In some cases, a random-access memory (RAM) 162 of the row controller 126A may also receive the state machine state (S) generated by the FSM 148. The RAM 162 may be used as storage for the configuration operations. Since the RAM 162 includes volatile memory, the storage provided via the RAM 162 may be temporary storage. Packets from the data path 144 and/or packets to be transmitted to the data path 144 may be stored temporarily in the RAM 162 before and/or after transmission via the data path 144. Operations used to read from the RAM 162 may be based on data indicated by a Read Pointer (RPTR) block 164. Operations used to write to the RAM 162 may be based on data indicated by a Write Pointer (WPTR) block 166. The pointer indicated by the data of the RPTR block 164 may be used to advance an address provided to the RAM 162 as data is read from the RAM 162, thereby providing real-time adjustment of pointers used to access data stored by the RAM 162. It is noted that in cases when the RAM 162 is not included in the row controller 126A, supporting circuitry may also be omitted. For example, without the RAM 162, some switching circuitry (e.g., 152B, 152C) may be omitted as well as some or all of the FPGA fabric interface control signals since the data loading may be performed via transmit through the μDR 112. In some cases, the FSM 148 may control the addresses indicated by the RPTR block 164 and/or the WPTR 166 when moving data to or from the data path 144 and/or the FSM 158 may control the address indicated by the RPTR block 164 and/or the WPTR 166 when moving data to or from microsector 92A.

The row controller 126A may convert the address indicated by the WPTR block 166 to a one hot-decoded value (e.g., thermometer encoded value, 10000000, 00000001) by using a decoder block 168 (1 hot decode). The one-hot encoded value may be used to select a CRAM to be written or read. It is noted that with one-hot encoded values, an integer value, such as an address or another integer encoded variable, may be replaced (e.g., translated) into a new binary variable, where a binary value (e.g., logical low bit, "0" or a logical high bit, "1" as is in the case of 111110 encoding) may added for each unique integer value. In this way, an address of ten may be represented by "0000000001" or "1111111110," while an address of four may be represented by "0001" or "1110," based on whether the encoding is using a "1" or a "0" to represent the various integer values. Other formats may be used based on the particular system implementation.

The row controller 126A may also include a parallel-serial converter block 170 (P2S S2P). The parallel-serial converter block 170 may change a format of the data from parallel to serial, and vice versa, such that the data may be serially shifted to and/or from the μDR 112 that may include individual data registers 172 (e.g., data register (DR) 172A, DR 172B, DR 172C, DR 172N) serially coupled.

Each DR 172 may include any suitable combination of logic gate circuitry and/or serially shifting circuitry. For example, the DR 172A may include one or more flip-flops, SR latches, multiplexing circuitry or the like to enable the row controller 126A to shift data in and/or out of the respective programmable logic 66 (e.g., disposed in region 174) associated with the microsector 92A. Indeed, the region 174 of the programmable logic 66 corresponding to the microsector 92A may include the LABs 104, the ALEs 110, the LCBs 114, and/or the routing fabric 116 described above with regards to at least FIG. 6.

The microsector 92A may sometimes include a scan register (μSR) 176. The μSR 176 may be of any suitable data width, and is shown as a 1-bit wide register. Indeed, the μSR 176 may include one or more scan registers 178 (e.g., scan register (SR) 178A, SR 178B, SR 178C, SR 178N). The row controller 126A may use the SRs 178 to scan data in and out of the user registers (e.g., DRs 172) to test functions programmed into the region 174 of the programmable logic 66, as is elaborated on in FIG. 11.

It is noted that the command received via the data path 144 may be of any suitable format or length. One example format is shown in FIG. 9.

Figure 9:
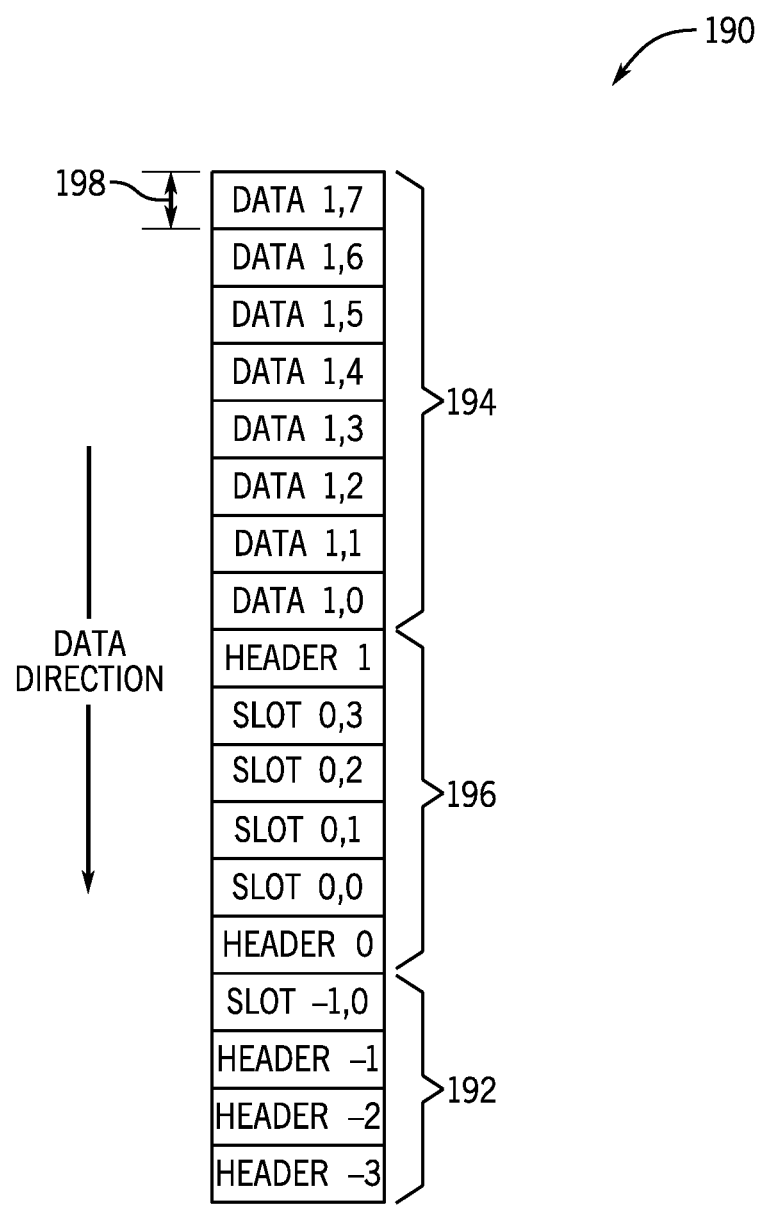
FIG. 9 is an illustration of a data packet used to control operations of the row controller of FIG. 8, in accordance with an embodiment.

FIG. 9 is an illustration of an example command transmitted to the row controllers 126. Sometimes a packet 190 transmitted via the data path 144 is shown as a streaming data packet, as opposed to a directly transmitted data packet. In this way, each row controller 126 of an AR 106 may monitor the data path 144 and identify from the packet 190 transmitted itself whether the packet 190 is relevant to operation of the respective row controller 126 (e.g., is meant for the respective row controller 126). Streaming data packets 190 may be sent using a protocol like Avalon Streaming or AXI 4 streaming.

The packet 190 is shown as including a header 192, write data 194, and slots 196 for read data. The packet 190, and thus each of the header 192, write data 194, and slots 196, may be made of portions of data 198 that respectively correspond to 1 word or 16 bits or 2 bytes, however these sizes may be configurable based on the particular implementation and/or the particular protocols being used to transmit the packet 190. The header 192 of the packet 190 may describe an address of a targeted row controller 126 and an operation to be performed by the targeted row controller 126. The address indicated by the header 192 may identify the targeted row controller 126 in a way interpretable by the different row controllers 126, such that the targeted row controller 126 may identify when the packet 190 is intended for itself (e.g., via the header 192 including its own address or matches at least a portion of an identifier for the targeted row controller 126). For example, a first row controller 126 may access the header 192 to determine whether the header 192 identifies it as the targeted row controller 126. When the header 192 identifies the first row controller 126 (e.g., a match between identifiers occurs), the first row controller 126 may shift the data packet 190 from the data path 144

(e.g., shared data path 144) for completion of the instructed operation (e.g., command). However, when the header 192 identifies another row controller 126, the first row controller 126 may return the packet 190 to the data path 144 such that the packet 190 may transmit on to another, or subsequently coupled row controller 126 disposed downstream of the data path 144 relative to the row controller 126. Subsequent portions of the data packet include the write data 194 and/or slots for the read data to be included in the packet 190 for return transmission to the controller 76, the LSM 130, and/or the CM 132, or other suitable circuitry.

The header 192 itself may include the command. For example, different headers 192 include different commands and different amounts of additional data to support execution and/or instruction of the different commands. Sometimes the header 192 includes a command that is encoded, such as by using 8 bits of command encoding. Encoding commands may provide expansion of functionality and/or increase an amount of information included in the header 192 to command the targeted row controller 126 by compressing data indicative of commands into a smaller size. More or less bits may be used to perform the command encoding. For example, some headers 192 may instruct a register write command, while other headers 192 may instruct a write data command and/or a read slot command. The component generating the packet 190 may include unallocated command space to reserve a slot for other intercepting devices to add in a command to the header 192, such as at a later time but prior to transmitting via the data path 144.

In some cases, the targeted row controller 126 receives an asserted end-of-packet signal that indicates that a symbol (e.g., portion of data) is a last symbol of a packet. The end-of-packet signal may be generated and transmitted by the controller 76, the LSM 130, and/or the CM 132, or other suitable circuitry to the row controller 126. In some cases, the targeted row controller 126 may access a packet length parameter and track (e.g., using a counter) a number of symbols received to determine when a symbol is a last symbol of a packet.

The register write command indicated by the encoded command corresponding to the header 192A may configure the targeted row controller 96 as well as request a read operation to occur (e.g., instruct a read operation). The register write command of the header 192A may be considered a single cycle message that includes immediate data to be written to a register of the row controller 126 (e.g., one or more of the CRAM registers 150). One of the key register write messages is a read request that permits a read of data stored at the register address.

Figure 10:
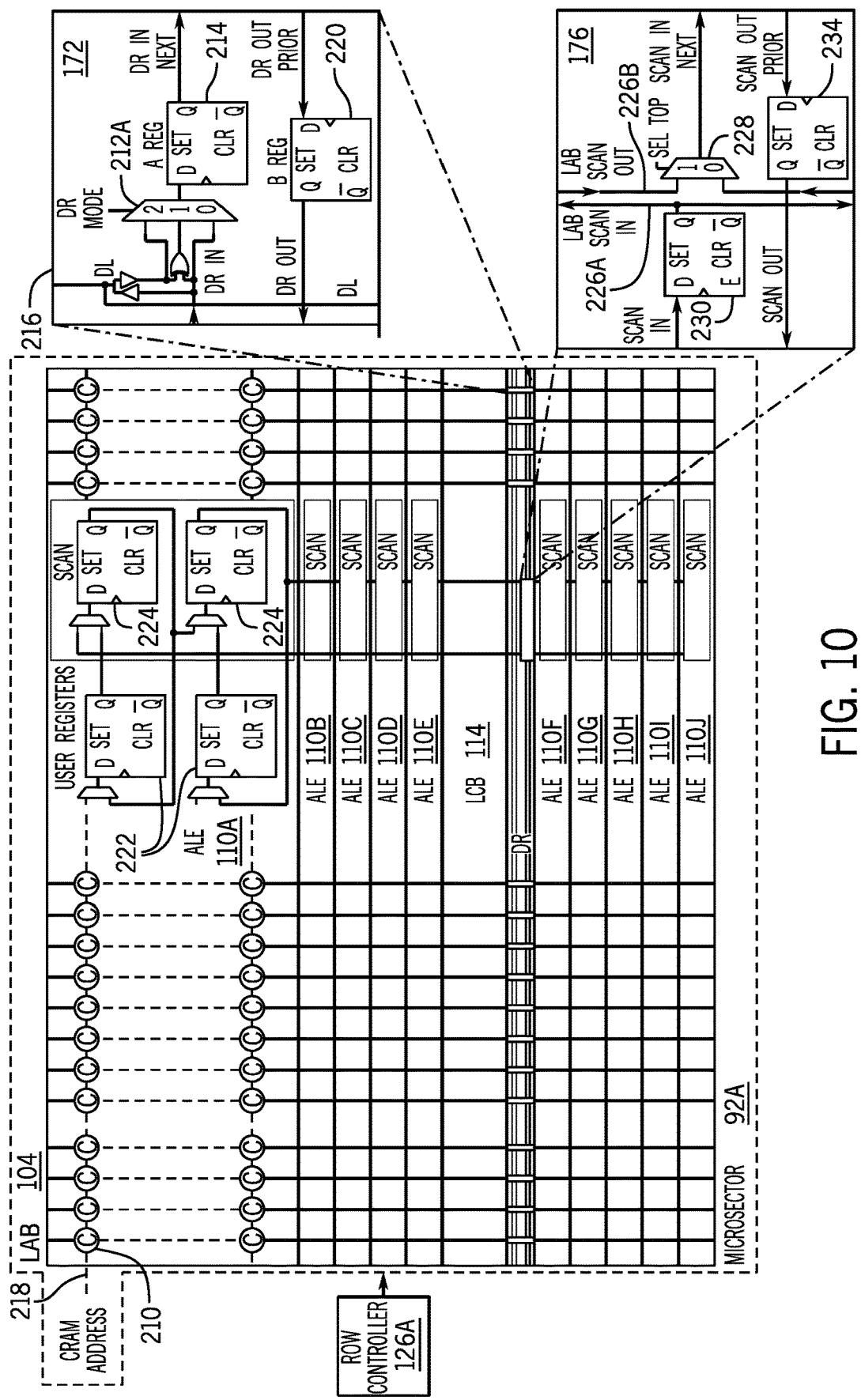
FIG. 10 is a block diagram of the row controller and the microsector of FIG. 8, in accordance with an embodiment.

To elaborate further on operations of the microsector 92A, FIG. 10 is a block diagram of the microsector 92A and the row controller 126A. FIG. 10 illustrates a respective LAB 104 of the microsector 92A from a configuration perspective, however it should be understood that there may be many additional functions of the LAB 104 not particularly shown or described herein. It is noted that the LAB 104 includes the ALEs 110 and the LCB 114, and the microsector 92A includes the DR 172 and the SR 178 separate from the LAB 104 but interconnected to the ALEs 110 and/or to the LCB 114.

Components of the LAB 104 may interface with configuration memory, such as configuration RAM (CRAM) 210 (C), or the portion of the programmable logic 66 able to be configured during (re)configuration operations (or partial reconfiguration operations). The microsector architecture may support two classes of operations—CRAM operations and User Register operations. The CRAM operations may be supported by logic controlling the µDR 112 while the User Register operations may be supported by logic controlling the µSR 176.

The µDR 112 may operate in a variety of operational modes at least in part by setting the operational mode across each of the DRs 172. For example, switching circuitry 212A may be used to control which operational mode the respective DRs 172 are operated. The µDR 112 may operate in a CRAM write mode (e.g., example write sequence) when the switching circuitries 212 are each set to "0." That is, when each respective DR 172 is to mode "0," the CRAM write data is permitted to be shifted through a DR A register 214. The DR A register 214 may include a flip-flop that serially couples to additional flip-flops, where each of the DRs 172 may include another of the DR A registers 214. A write signal (not shown) may permit a data line (DL) 216 to be driven with data from the DR A register 214. An address line 218 (CRAM address) of the row of CRAM 210 that is to be written may be asserted while the µDR 112 is operated in the CRAM write mode, permitting data to be written into the address CRAM frame. As a reminder, the address written to the address line 218 may be a an address represented in a one-hot decoded value (e.g., 00001, 10000, 001), thereby enabling a single logical high bit to be used to select which of the CRAM 210 for the particular write (or read operation as described below).

The µDR 112 may sometimes operate in a CRAM read mode (e.g., example read sequence) when the switching circuitries 212 are each set to "2." That is, when each respective DR 172 is set to mode "2," a read signal may permit the DL 216 to be driven with data from selected CRAM 210. A portion of the CRAM 210 may be selected using the address line 218. For example, the address line 218 of the row of the CRAM 210 that is to be read may be asserted, causing that CRAM frame of data to be driven onto the DL 216. Read data from the selected row of the CRAM 210 is output to the DL 216 and loaded into the DR A registers 214. At the end of the microsector 92A row (e.g., when the data has shifted down to DR 172N shown in FIG. 8), the DR In Next Signal from the DR A register 214 is coupled to the DR Out Prior signal path (e.g., input into the DR B register 220), permitting the data from the selected CRAM 210 to be shifted back to the microsector 92A. It is noted that the DR In Next Signal path and/or the DR Out Prior signal path may be 1-bit wide, or any suitable data width wide. In this way, read data may be transported from the selected CRAM 210 to the microsector 92A by way of at least a portion of the DR A register 214 and at least a portion of the DR B register 220 (e.g., at least one flip-flop of each).

The µDR 112 may yet, at another time, operate in another operational mode, a CRAM SEU detect mode (e.g., example sequence) when the switching circuitries 212 are each set to "1." That is, when each respective DR 172 is to mode "1," a current read CRAM 210 value may be XOR'd with data from one or more prior CRAM columns shifted read data before being loaded into the DR A register 214.

The microsector 92A may also include a scan register (µSR) 176, for example, to be used to perform design verification operations or verification operations. The µSR 176 is shown as a 1-bit wide register. Indeed, the µSR 176 may include one or more SRs 178. The SRs 178 may be used to scan test data in and out of the user registers (e.g., DRs 172) from the RAM 162 to test functions programmed into the region 174 of the programmable logic 66, as introduced in FIG. 8. Indeed, user data (e.g., implementation data) may be shifted through either of the top set of the ALE 110s (e.g., ALE 110A through ALE 110E) user registers 222 and scan flip-flops 224 or through the bottom set of the ALE 110s (e.g., ALE 110J through ALE 110F) user registers 222 and scan flip-flops 224 via data paths 226 (e.g., LAB Scan In data path 226A, LAB Scan Out data path 226B).

When in a scan mode, a scan chain is formed from the µDR 112 up through the top-most scan flip-flop 224 and then down through each scan flip-flop 224 back to the µDR 112. The mux on the D input of the scan flip-flop 224 for the ALE 110A at the top of the LAB 104 receives the scan input from the µDR output (e.g., LAB Scan In data path 226A). SCAN blocks between the top-most ALE 110A row and the µDR 112 receive a scan input into the mux on the LAB Scan In data path 226A from the ALE 110 row disposed above it.

For example, to perform verification operations, test data may be shifted into the top set of ALEs 110 (e.g., ALE 110A through ALE 110E) before being shifted into the bottom set of ALEs 110 (e.g., ALE 110J through ALE 110F). Toggling between which of the ALEs 110 may occur via switching circuitry 228, that receives a "select top" (SEL TOP) control signal, such as from the controller 76, the row controller 126, the CRAM register 150, or the like. This process may be repeated for each microsector 92 until each microsector 92 has each µSR 176 is loaded. In some cases, the process is repeated at least partially in parallel. Once loaded, a scan load signal (not shown) may be asserted, such as by the controller 76, the LSM 130, and/or the CM 132 to load the scan values into the user registers 222 via the LAB Scan In data path 226A. After loading of the scan values into the user registers 22, the scan load signal is de-asserted and the user registers 222 are clocked. Values from the user registers are loaded, for one or more microsectors 92, into the corresponding SRs 178 and shifted out via the LAB Scan Out data path 226B, permitting the new values of the test data to be loaded into the user registers (e.g., ALE 110s).

When the row controller 126 includes the RAM 162, user data from the ALEs 110 may be stored temporarily in the RAM 162 while operation is verified, such as by verifying a computation result based on the test data to be as expected and/or by verifying timing to reload the SRs 178 to match an expected timing value and/or be within a threshold of difference of the expected timing value. Once the test is complete, the user data may be reloaded into the ALEs 110 from the RAM 162 using a similar data shifting process.

To elaborate further on how data is serially shifted through the µSR 176, when loading the test data into the user registers 222, a first SR 178A may receive the test data first at its flip-flop 230. The flip-flop 230 may output the data from the user registers 222 via the LAB Scan Out data path 226B to the subsequently coupled next flip-flop 230 of the second SR 178B. This may repeat until the user data from the user registers 222 reaches the flip-flop 230 of the last SR 178N. The user data from the user registers 222 is clocked to flip-flop 234 since the output from switching circuitry 228 (e.g., Scan In Next signal path) is coupled to the input of the flip-flop 234 in the last SR 178N (e.g., Scan Out Prior signal path), permitting the user data to be clocked back to the respective row controller 126 for temporary storage in the RAM 162, while continuing to load the test data into each of the user registers 222. It is noted that the Scan In Next signal path and/or Scan Out Prior may be 1-bit wide, or any suitable data width wide. The user data may be reloaded using a same process as used to load the test data, however the user data may be read from the RAM 162 of each respective row controller 126 for respective loading into the microsectors 92A.

To program configuration memory (CRAM 210), certain operations may take place. These operations may include sequences of write commands, read commands, and the like. For example, to initially configured the microsector 92A, the controller 76 may assign the microsector 92A a particular identifier (e.g., write command to write an identifier to the ID Decode block 146) and perform a warm reset on CRAM registers 150 of the row controller 126A for the microsector 92A. The warm reset may operate the control registers for the microsector 92A in a known safe functional state without affecting a configuration state of the circuitry of the microsector 92A and/or the row controller 126A. The controller 76 may then change a state of one or more switching circuitries (e.g., switching circuitry 152, other multiplexer circuitry) to power a CRAM power mux within the microsector 92A. The controller 76 may proceed to write redundancy and operating condition (e.g., power (P), voltage (V), temperature (T)) control settings, access control settings, authentication settings, or the like. When the microsector 92A and/or the row controller 126A is configured with the initial operational settings described above, the controller 76 may write freeze control and permit the microsector 92A to be taken out of a or put in a user mode to permit the microsector 92A to have a circuit design or a portion of a circuit design loaded into its configuration memory and/or circuitry.

Another command example is a "Write RAM contents, Read RAM contents" control sequence, such as may be used in cases when the row controller 126 includes the RAM 162. These commands may be used by the controller 76 to read or write contents of the RAM 162 to or from the data path 144 for access via the data path 144. A write to the RAM 162 may be performed to a local address (LADDR) in the RAM 162 with the data to be written being transmitted with the packet 190 via the data path 144. A read from the RAM 162 may be performed from the LADDR in the RAM 162 and the data to be read is placed in the message slots (e.g., slots 196). Similarly, reading from or writing to configuration memory (e.g., CRAM 210) and/or other circuitry (e.g., LABs 104) within the microsector 92A may be done using the same methods of data transfer to or from the data path 144 via the RAM 162. In this way, data to be written to the configuration memory may be access from the data path 144 and stored in RAM 162 before being written to the configuration memory. The reverse applies too, where data to be read from configuration memory is written to the RAM 162 before being written to the data path 144 as data stored in slots 196 of an outgoing packet 190.

Figure 11:
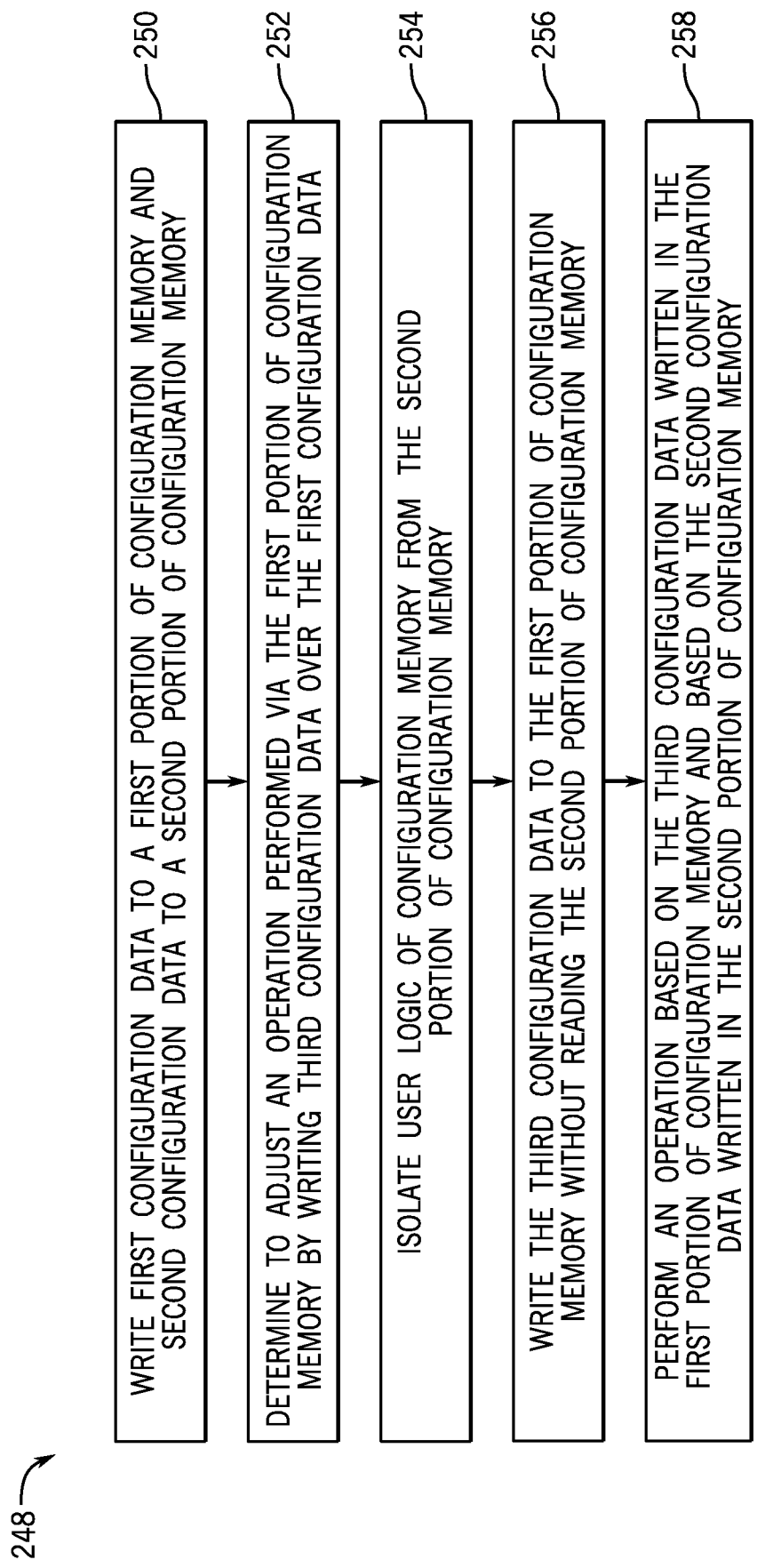
FIG. 11 is a flowchart of a method for partial reconfiguration of the programmable logic of FIG. 4B, in accordance with an embodiment.

To elaborate further on example operations of the integrated circuit 12 and its system, FIG. 11 is a flowchart of a process 248 for performing a partial reconfiguration of the programmable logic 66 having a microsector architecture. It is noted that, although depicted in a particular order, the blocks of the process 248 may not represent an exhaustive list of operations, and more or less operations may be performed and/or at least some blocks may be skipped altogether. As described herein, the process 248 is described as performed by the controller 76, however, it should be understood that any suitable processing and/or control circuitry may perform some or all of the operations of the controller 76, such as one or more of the CM 132, LSM 130, or other control circuitry of the integrated circuit 12.

At block 250, the controller 76 may write first configuration data to a first portion of configuration memory (e.g., CRAM 210) and may write second configuration data to a second portion of configuration memory (e.g., CRAM 210). The first configuration data and the second configuration data may be configuration data associated with implementing one or more circuit designs or computational functions into the programmable logic 66, and thus may be associated with a user circuit design and/or a circuit design to be included with a device by a provider or manufacturer of the device, or be generated by any suitable design software. After writing a configuration into the programmable logic 66, the controller 76 may determine to adjust the configuration, such as to adjust an operation performed using the programmable logic 66, to adjust a computation performed using the programmable logic 66, to add additional features to the circuit design implemented in the two portions of CRAM 210, or the like.

In response to determining to adjust the configuration, at block 252, the controller 76 may determine to adjust the operation performed via the first portion of configuration memory at least in part by writing third configuration data over the first configuration data already stored. This may be a direct write operation that does not involve a reading out and modification operation to adjust the first configuration data.

To do so, at block 254, the controller 76 may isolate user logic associated with the first portion of configuration memory from a second portion of configuration memory. Configuration memory may be reconfigured along microsector 92 boundaries, where the first portion of configuration memory may be of a first microsector 92 and where the second portion of the configuration memory may be of a second microsector 92. User logic corresponding to the first portion of configuration memory may be functionally isolated from other portions of configuration memory, including the second portion of configuration memory, by using the addressing techniques described herein to reference a specific intersection of DR 172 and CRAM 210 and/or user register 222. The addressing techniques described above, such as with reference to FIG. 10 as an example, may permit configuration memory 210 of a first ALE 110A to be referenced separately from configuration memory 210 of any other ALE 110 (e.g., ALE 110B, ALE 110C, etc.) and/or of configuration memory also included within the first ALE 110A. It is noted that no isolation operation may be used for the configuration memory 210. Microsectors may do so that by their nature. However, the functional user logic that the CRAM 210 controls may be functionally isolated. Meaning if that user logic is performing a first operation (e.g., transform A) and is being reconfigured to perform a second operation (e.g., transform B), data is to stop flowing through the user logic while the transition in programmed operations occurs. After configuration of the second operation is finished, data may be returned to the user logic, for example, by using ready and valid signals at an interface outside of the changing region (e.g., as microsector control signals from FSM 158) held steady during the reconfiguration.

It is noted that when a portion of the integrated circuit 12 is unused for a particular data transmission or processing operation, the portion of the integrated circuit 12 may be power gated or operated in a low power state. In these reduced power consumption states, the integrated circuit 12 may consume less power, thereby reducing power consumption of the application system 62 overall.

Once isolated, at block 256, the controller 76 may write the third configuration data directly to the first portion of configuration memory without adjusting or reading the second portion of configuration memory. Once written, at block 258, the controller 76 may perform an operation based on the third configuration data written in the first portion of the configuration memory and based on the second configuration data written in the second portion of configuration memory.

While the embodiments set forth in the present disclosure may be susceptible to various modifications and alternative forms, specific embodiments have been shown by way of example in the drawings and have been described in detail herein. For example, any suitable combination of the embodiments and/or techniques described herein may be implemented. Moreover, any suitable combination of number formats (e.g., single-precision floating-point, half-precision floating-point, bfloat16, extended precision and/or the like) may be used. Further, each DSP circuitry and/or DSP architecture may include any suitable number of elements (e.g., adders, multipliers 64, routing, and/or the like). Accordingly, it should be understood that the disclosure is not intended to be limited to the particular forms disclosed. The disclosure is to cover all modifications, equivalents, and alternatives falling within the spirit and scope of the disclosure as defined by the following appended claims.

Technical effects of the present disclosure include system and methods that provide a microsector architecture. The microsector architecture described herein may benefit operations of programmable logic devices, such as field programmable gate arrays and/or other configurable devices, by permitting programming of programmable fabric to occur over smaller regions of fabric. The systems and methods described herein may enable a 1-bit wide data register (e.g., a micro-data register (μDR)) to transmit data to or from the smaller regions of programmable fabric. By reducing a size of a sector used for programming functions into a programmable logic device, configuration speeds may increase since relatively higher amounts of configuration operations may be performed in parallel, reducing a total amount of time used to (re)configure programmable logic fabric and/or programmable circuitries. Indeed, microsector architectures may also improve partial reconfiguration operations, or configuration operations perform while the programmable logic device is operating or during runtime, to enable configuration methods to improve as well as configuration speeds. For example, the microsector architecture may eliminate or reduce a likelihood that a read-modify-write configuration scheme is used to reconfiguration a portion of the programmable logic device. For example, device configurations loaded in programmable logic may be read from configuration memory to a memory external to the programmable logic, modified externally to the configuration memory, then rewritten (as modified) to the configuration memory to reconfigure the configuration memory. By using the microsector architecture, user logic to be modified may be functionally isolated from nearby or adjacent configuration memory to be unaltered, such as is generally described at least with FIG. 11. However, the structure of the microsector circuitry isolates configuration memory between different microsectors, permitting a skipping of an explicit isolation operation to isolation configuration memory to be reconfigured from configuration memory to not be reconfigured. These processes may reduce a complexity of reconfiguration operations as well as reduce an amount of time used for the reconfiguration since the process may become a write-only operation that writes configuration data directly to the configuration memory to be modified and/or without a reliance on an isolation operation of configuration memory.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments of the Disclosure

The following numbered clauses define certain example embodiments of the present disclosure.

Clause 1.
An integrated circuit, comprising:
a plurality of microsectors arranged in a row and column grid, wherein the plurality of microsectors comprises a first microsesctor communicatively coupled to a first row controller; and
a controller configured transmit a command and data from a second row controller to the first row controller, down a column of rows, wherein the first row controller is configured to perform an operation in response to the command using the data.

Clause 2.
The integrated circuit of example embodiment 1, wherein the plurality of microsectors comprises a second microsector disposed at a different position within the row and column grid than the first microsector, wherein the row controller is configured to program the first microsector at least partially in parallel with the second microsector.

Clause 3.
The integrated circuit of example embodiment 1, wherein the plurality of microsectors comprises a second microsector disposed at a different row within the row and column grid than the first microsector, and wherein the row controller is configured to program the second microsector at least partially in parallel with the first microsector.

Clause 4.
The integrated circuit of example embodiment 1, comprising a third row controller disposed below the first row controller, wherein the third row controller and the first row controller are coupled to a shared data path, and wherein the first row controller is configured to access the command transmitted via the shared data path before the second row controller is permitted to access the command.

Clause 5.
The integrated circuit of example embodiment 4, wherein a streaming data packet comprises the command and the data, and wherein the streaming data packet comprises the command as part of a header.

Clause 6.
The integrated circuit of example embodiment 4, wherein the first row controller is configured to:
determine that the header matches at least a portion of an identifier associated with the first row controller; and
shift the data packet from the shared data path to stop transmission of the data packet via the shared data path.

Clause 7.
The integrated circuit of example embodiment 4, wherein the header comprises an indication of a command to be performed by a target row controller, and wherein the header comprises an indication of the target row controller.

Clause 8.
The integrated circuit of example embodiment 1, wherein the first microsector comprises a plurality of logic access blocks each coupled to a data register.

Clause 9.
The integrated circuit of example embodiment 8, wherein the data register comprises a 1-bit wide data path, a first flip-flop, and a second flip-flop, and wherein the 1-bit wide data path couples between the first flip-flop and the second flip-flop.

Clause 10.
A method, comprising:
receiving a data packet from a data path, wherein the data path is coupled to a plurality of row controllers; and
generating, using a finite state machine, a plurality of control signals to write at least some of the data packet into a configuration memory of a microsector based at least in part by a shifting of at least some of the data packet into the configuration memory using a 1-bit data register of the microsector disposed separate from the configuration memory.

Clause 11.
The method of example embodiment 10, comprising:
determining the data packet comprises:
a header matching an identifier stored in a decoder;
a first data portion corresponding to configuration data to be stored in a first register; and
a second data portion corresponding to data to be written in the configuration memory; and
storing the first data portion in the first register and storing the second data portion in a volatile memory.

Clause 12.
The method of example embodiment 11, comprising generating the plurality of control signals based at least in part on the first data portion written in the first register.

Clause 13.
The method of example embodiment 11, comprising generating, via a local sector manager disposed outside programmable logic of a programmable logic device, the data packet, wherein the header is configured to indicate a command to be implemented by a respective row controller of the plurality of row controllers.

Clause 14.
The method of example embodiment 10, comprising:
receiving a subsequent data packet comprising a header from the data path, wherein the data path is coupled to a plurality of row controllers;
determining that the header does not match an identifier stored in a decoder; and
returning the subsequent data packet to the data path for transmission to another row controller.

Clause 15.
A system, comprising:
programmable logic comprising a plurality of configuration memory;
first control circuitry disposed outside the programmable logic and on a same board; and
second control circuitry disposed between portions of the programmable logic and on the same board, wherein the second control circuitry is configured to:
receive a data packet via a data path from the first control circuitry, wherein the data path is coupled to a plurality of row controllers associated with the second control circuitry; and
generate, using a first respective row controller of the plurality of row controllers, a plurality of control signals based at least in part on the data packet, wherein the plurality of control signals are used to read from or write to a microsector comprising a subset of the plurality of configuration memory.

Clause 16.

The system of example embodiment 15, wherein the second control circuitry is configured to read data from the subset of the plurality of configuration memory of the microsector based at least in part by shifting of target data through each 1-bit data register of the microsector at least once.

Clause 17.

The system of example embodiment 15, wherein the second control circuitry is configured to write data to the subset of the plurality of configuration memory of the microsector based at least in part by shifting of target data through each 1-bit data register of the microsector no more than once.

Clause 18.

The system of example embodiment 15, wherein the microsector comprises a scan register used to perform verification operations.

Clause 19.

The system of example embodiment 15, wherein the first control circuitry is configured to generate the data packet, wherein the data packet comprises a header is configured to indicate a command to be implemented by a respective row controller of the plurality of row controllers.

Clause 20.

The system of example embodiment 15, wherein the first respective row controller is configured to receive the data packet and, after verifying that the data packet comprises a header having an identifier matching an identifier of the first respective row controller, generating the plurality of control signals to implement a command indicated by the header.

What is claimed is:

1. An integrated circuit, comprising:
a plurality of microsectors arranged in a row and column grid, wherein the plurality of microsectors comprises a first microsector communicatively coupled to a first row controller; and
a controller configured transmit a streaming data packet from a second row controller to the first row controller, down a column of rows, wherein the streaming data packet comprises data and a header, wherein the header comprises an indication of a target row controller and an indication of a command to be performed by the target row controller, and wherein the first row controller is configured to perform an operation based on the data in response to the command.

2. The integrated circuit of claim 1, wherein the plurality of microsectors comprises a second microsector disposed at a different position within the row and column grid than the first microsector.

3. The integrated circuit of claim 1, wherein the plurality of microsectors comprises a second microsector disposed at a different row within the row and column grid than the first microsector.

4. The integrated circuit of claim 1, comprising a third row controller disposed below the first row controller, wherein the third row controller and the first row controller are coupled to a shared data path.

5. The integrated circuit of claim 4, wherein the first row controller is configured to:
determine that the header matches at least a portion of an identifier associated with the first row controller; and
shift the streaming data packet from the shared data path to stop transmission of the streaming data packet via the shared data path.

6. The integrated circuit of claim 1, wherein the first microsector comprises a plurality of logic access blocks each coupled to a data register.

7. The integrated circuit of claim 1, wherein the data is associated with configuration data.

8. The integrated circuit of claim 1, wherein the first row controller and the second row controller are coupled to a shared data path, and wherein the first row controller is configured to access the command transmitted via the shared data path before the second row controller is permitted to access the command.

9. The integrated circuit of claim 1, wherein the first microsector comprises a scan register.

10. The integrated circuit of claim 6, wherein the data register comprises a 1-bit wide data path, a first flip-flop, and a second flip-flop, and wherein the 1-bit wide data path couples between the first flip-flop and the second flip-flop.

11. A method, comprising:
receiving, via a row controller of a plurality of row controllers, a data packet from a data path, wherein the data path is coupled to the plurality of row controllers, and wherein the data packet comprises data and a first header;
determining, via the row controller, that the first header does not match an identifier stored in a decoder; and
returning, via the row controller, the data packet to the data path for transmission to another row controller of the plurality of row controllers based on determining that the first header does not match the identifier.

12. The method of claim 11, comprising:
receiving, via the row controller, an additional data packet from the data path; and
storing, via the row controller, a first portion of data of the additional data packet in a register and storing a second portion of the data of the additional data packet in a volatile memory.

13. The method of claim 12, comprising generating, via the row controller, a plurality of control signals based on the first portion of the data written in the register.

14. The method of claim 12, wherein the first header is configured to indicate a respective row controller of the plurality of row controllers.

15. The method of claim 11, comprising:
receiving, via the row controller, a subsequent data packet comprising a second header from the data path after receiving the data packet;
determining, via the row controller, that the second header matches the identifier stored in the decoder; and
generating, via the row controller, one or more control signals to access a configuration memory of a microsector based at least in part by a shifting a portion of the subsequent data packet via a data register of the microsector.

16. A system, comprising:
programmable logic comprising a plurality of configuration memory;
first control circuitry disposed on a same board as the programmable logic; and
second control circuitry disposed between portions of the programmable logic and on the same board, wherein the second control circuitry is configured to:
receive configuration data via a data path from the first control circuitry, wherein the data path is coupled to a plurality of row controllers associated with the second control circuitry; and
generate, using a first respective row controller of the plurality of row controllers, a plurality of control signals based on the configuration data, wherein the plurality of control signals are used to read from or write to a microsector, wherein the microsector comprises a subset of the plurality of configuration memory and a scan register, wherein the microsector is configured to perform a verification operation based on the scan register.

17. The system of claim 16, wherein the second control circuitry is configured to read data from the subset of the plurality of configuration memory of the microsector based at least in part by shifting of target data through each 1-bit data register of the microsector at least once.

18. The system of claim 16, wherein the second control circuitry is configured to write data to the subset of the plurality of configuration memory of the microsector based at least in part by shifting of target data through each 1-bit data register of the microsector no more than once.

19. The system of claim 16, wherein the first control circuitry is configured to generate the configuration data, wherein the configuration data comprises a header is configured to indicate a command to be implemented by a respective row controller of the plurality of row controllers.

20. The system of claim 16, wherein the first respective row controller is configured to receive the configuration data and, after verifying that the configuration data comprises a header having a first indication of an identifier matching a second indication of the identifier stored in a decoder of the first respective row controller, generating the plurality of control signals to implement a command indicated by the header.

* * * * *